United States Patent
Leung et al.

(10) Patent No.: US 9,788,454 B1
(45) Date of Patent: Oct. 10, 2017

(54) APPARATUS, SYSTEM, AND METHOD FOR IMPROVING COMMUNICATIVE CONNECTIONS BETWEEN FIELD-REPLACEABLE UNITS AND TELECOMMUNICATION SYSTEMS

(71) Applicant: Juniper Networks, Inc., Sunnyvale, CA (US)

(72) Inventors: Jimmy Chun-Chuen Leung, Fremont, CA (US); John I. Kull, Redwood City, CA (US); Seongchul C. Kim, Saratoga, CA (US); Franklin D. Boyden, Pleasanton, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/081,824

(22) Filed: Mar. 25, 2016

(51) Int. Cl.
*H05K 7/04* (2006.01)
*H05K 7/02* (2006.01)
*H05K 7/18* (2006.01)
*H05K 7/14* (2006.01)

(52) U.S. Cl.
CPC .............. *H05K 7/186* (2013.01); *H05K 7/14* (2013.01)

(58) Field of Classification Search
CPC .................................. H05K 7/186; H05K 7/14
USPC .......................................... 361/807, 809, 810
See application file for complete search history.

(56) References Cited

U.S. PATENT DOCUMENTS

| 4,946,300 A * | 8/1990 | Makita | B41J 3/36 361/679.06 |
|---|---|---|---|
| 8,295,055 B2 * | 10/2012 | Van Der Mee | H05K 7/1407 361/727 |
| 9,370,118 B2 * | 6/2016 | Li | H05K 7/1409 |
| 2009/0058236 A1 * | 3/2009 | Lin | E05B 65/006 312/223.2 |
| 2009/0086456 A1 * | 4/2009 | Milo | H05K 7/1409 361/801 |

* cited by examiner

*Primary Examiner* — Hung S Bui
(74) *Attorney, Agent, or Firm* — FisherBroyles, LLP

(57) ABSTRACT

The disclosed apparatus may include (1) a housing designed to house a field-replaceable unit within a telecommunication system, (2) a connector that is designed to electrically interface the field-replaceable unit with the telecommunication system in the housing, (3) a spring that is coupled to the housing, and (4) a movable injection cam that is coupled to the spring such that, when the field-replaceable unit is installed in the housing by way of an ejection lever that presses against the movable injection cam, the spring applies a force on the movable injection cam that causes the movable injection cam to push the field-replaceable unit toward the connector. Various other apparatuses, systems, and methods are also disclosed.

20 Claims, 9 Drawing Sheets

APPARATUS, SYSTEM, AND METHOD FOR IMPROVING COMMUNICATIVE CONNECTIONS BETWEEN FIELD-REPLACEABLE UNITS AND TELECOMMUNICATION SYSTEMS

BACKGROUND

Telecommunication systems (such as routers) are often used to facilitate the flow of traffic within networks. These telecommunication systems may include slots and/or housings for field-replaceable units (such Physical Interface Cards (PICs)) that provide physical communication ports for carrying traffic. For example, a telecommunication system may include a Flexible PIC Concentrator (FPC) that provides slots and/or housings for a certain number of PICs. When a PIC is inserted and/or installed into the FPC, the PIC and the FPC may form a communicative connection that facilitates the flow of traffic across one another.

Unfortunately, in the event that any significant "de-mate" or "under-mate" exists and/or occurs between the PIC and the FPC, the signal integrity of the traffic may diminish as the speed of the traffic increases above a certain level. In this context, the terms "de-mate" and "under-mate" generally refer to any state and/or condition in which an air gap and/or deficient contact interferes with and/or impairs communications transferred at a certain speed across a connection. This diminished signal integrity may lead to errors, misinterpretations, and/or failures in the software and/or firmware of the telecommunication system. As a result, the telecommunication system may experience a decrease in performance and/or reliability when forwarding traffic at high speeds (e.g., at or above 25 gigahertz).

The instant disclosure, therefore, identifies and addresses a need for apparatuses, systems, and methods for improving communicative connections between field-replaceable units and telecommunication systems.

SUMMARY

As will be described in greater detail below, the instant disclosure generally relates to apparatuses, systems, and methods for improving communicative connections between field-replaceable units and telecommunication systems. In one example, an apparatus for accomplishing such a task may include (1) a housing designed to house a field-replaceable unit within a telecommunication system, (2) a connector that is designed to electrically interface the field-replaceable unit with the telecommunication system in the housing, (3) a spring that is coupled to the housing, and (4) a movable injection cam that is coupled to the spring such that, when the field-replaceable unit is installed in the housing by way of an ejection lever that presses against the movable injection cam, the spring applies a force on the movable injection cam that causes the movable injection cam to push the field-replaceable unit toward the connector.

Similarly, a telecommunication system incorporating the above-described apparatus may include (1) a housing designed to house a field-replaceable unit, (2) a connector that is coupled to a unit concentrator and designed to electrically interface the field-replaceable unit with the unit concentrator in the housing, (3) a spring that is coupled to the housing, and (4) a movable injection cam that is coupled to the spring such that, when the field-replaceable unit is installed in the housing by way of an ejection lever that presses against the movable injection cam, the spring applies a force on the movable injection cam that causes the movable injection cam to push the field-replaceable unit toward the connector.

A corresponding method may include (1) coupling a spring to a housing that is (A) designed to house a field-replaceable unit within a telecommunication system and (B) equipped with a connector that is designed to electrically interface the field-replaceable unit with the telecommunication system and (2) coupling a movable injection cam to the spring such that, when the field-replaceable unit is installed in the housing by way of an ejection lever that presses against the movable injection cam, the spring applies a force on the movable injection cam that causes the movable injection cam to push the field-replaceable unit toward the connector.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
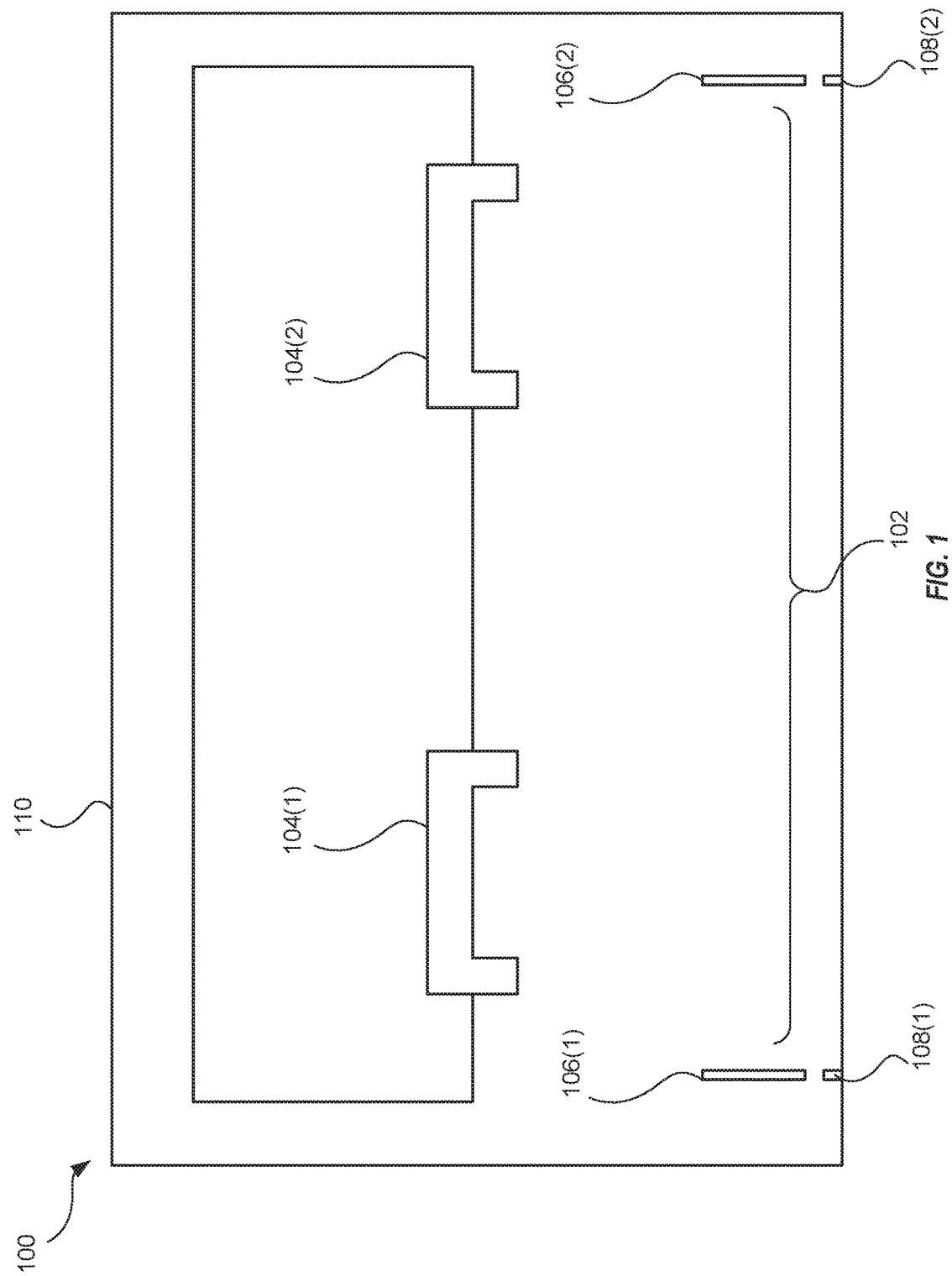
FIG. 1 is a block diagram of an exemplary apparatus for improving communicative connections between field-replaceable units and telecommunication systems.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improving communicative connections between field-replaceable units and telecommunication systems. As will be explained in greater detail below, embodiments of the instant disclosure may mitigate, decrease, and/or eliminate de-mate or under-mate that exists and/or occurs between field-replaceable units and telecommunication systems. Accordingly, embodiments of the instant disclose may effectively compensate for and/or offset any variation, inconsistency, and/or tolerance resulting from imperfect manufacturing and/or assembly of connectors used to connect field-replaceable units and telecommunication systems with one another. This compensation and/or offset may facilitate maintaining and/or improving the signal integrity of high-speed traffic (e.g., at or above 25 gigahertz) handled by telecommunication systems.

As a result, embodiments of the instant disclosure may enable telecommunication systems to avoid software errors, misinterpretations, and/or failures resulting from poor signal integrity. Embodiments of the instant disclosure may thus improve and/or increase the performance and/or reliability of telecommunication systems when forwarding traffic at high speeds (e.g., at or above 25 gigahertz). The terms "de-mate" and "under-mate," as used herein with reference to a connection, generally refer to any state and/or condition in which an air gap and/or deficient contact interferes with and/or impairs communications transferred at a certain speed across the connection.

The following will provide, with reference to FIG. 1-8, detailed descriptions of exemplary apparatuses and corresponding implementations that improve communicative connections between field-replaceable units and telecommunication systems. In addition, detailed descriptions of exemplary methods for improving communicative connections between field-replaceable units and telecommunication systems will be provided in connection with FIG. 9.

FIG. 1 shows an exemplary apparatus 100 for improving communicative connections between field-replaceable units and telecommunication systems. As illustrated in FIG. 1, apparatus 100 may include a housing 102 designed to house a field-replaceable unit within a telecommunication system 110. The term "housing," as used herein, generally refers to any type or form of slot, receptacle, and/or enclosure that accepts and/or is fitted for a field-replaceable unit within a telecommunication system. In one example, housing 102 may include and/or represent a slot and/or receptacle within an FPC of telecommunication system 110. In this example, housing 102 may be designed and/or fitted to house a PIC inserted and/or installed into the FPC.

Examples of telecommunication system 110 include, without limitation, routers (such as provider edge routers, hub routers, spoke routers, autonomous system boundary routers, and/or area border routers), FPCs, switches, hubs, modems, bridges, repeaters, gateways, multiplexers, network adapters, network interfaces, network racks, chasses, servers, computing devices, portions of one or more of the same, combinations or variations of one or more of the same, and/or any other suitable telecommunication system.

As illustrated in FIG. 1, apparatus 100 may also include one or more connectors, such as connectors 104(1) and 104(2). The term "connector," as used herein, generally refers to any type or form of full or partial fastener, fitting, receptacle, and/or coupling that facilitates a communicative connection and/or interface between a field-replaceable unit and a telecommunication system. In one example, connectors 104(1) and 104(2) may be designed to communicatively interface a PIC with an FPC of telecommunication system 110. In this example, connectors 104(1) and 104(2) may each include and/or represent one side of a connection and/or interface between the PIC and the FPC. In particular, this side of the connection and/or interface may be located on and/or provided by the FPC. The other side of the connection and/or interface may be located on and/or provided by the PIC.

In some examples, connectors 104(1) and 104(2) may include and/or represent electrical connectors that facilitate communication by way of electrical signals. In other examples, connectors 104(1) and 104(2) may include and/or represent optical connectors that facilitate communication by way of optical signals.

As illustrated in FIG. 1, apparatus 100 may further include one or more springs, such as springs 106(1) and 106(2). The term "spring," as used herein, generally refers to any type or form of device, object, and/or mechanism that stores and/or discharges mechanical energy and/or force. Examples of springs 106(1) and 106(2) include, without limitation, tension springs, extension springs, leaf springs, horseshoe springs, torsion springs, compression springs, coil springs, constant-force springs, gas springs, combinations or variations of one or more of the same, and/or any other suitable springs.

In one example, springs 106(1) and 106(2) may be coupled to housing 102 within telecommunication system 110. In this example, springs 106(1) and 106(2) may be designed and/or set to apply and/or exert a force that pushes a PIC toward connectors 104(1) and 104(2). In other words, springs 106(1) and 106(2) may be designed and/or set to apply and/or exert a force that causes connectors on a PIC to securely and/or sufficiently press against connectors 104(1) and 104(2), thereby forming and/or creating a secure physical connection between the field-replaceable unit and telecommunication system 110 so as to maintain the signal integrity of traffic that passes through that physical connection at high speeds (e.g., at or above 25 gigahertz).

As illustrated in FIG. 1, apparatus 100 may further include one or more movable injection cams, such as movable injection cams 108(1) and 108(2). The term "movable injection cam," as used herein, generally refers to any type or form of physical member, object, and/or shaft that movably and/or physically interfaces with an ejection lever of a field-replaceable unit to facilitate securing the filed-replaceable unit to a telecommunication system. Examples of movable injection cams 108(1) and 108(2) include, without limitation, members, handles, levers, shafts, arms, knobs, portions of one or more of the same, combinations or variations of one or more of the same, and/or any other suitable movable injection cams.

In one example, movable injection cams 108(1) and 108(2) may be coupled to springs 106(1) and 106(2). Although often discussed herein as being separate and/or distinct from springs 106(1) and 106(2), movable injection cams 108(1) and 108(2) may, in some embodiments, form and/or be considered part of springs 106(1) and 106(2).

Figure 2:
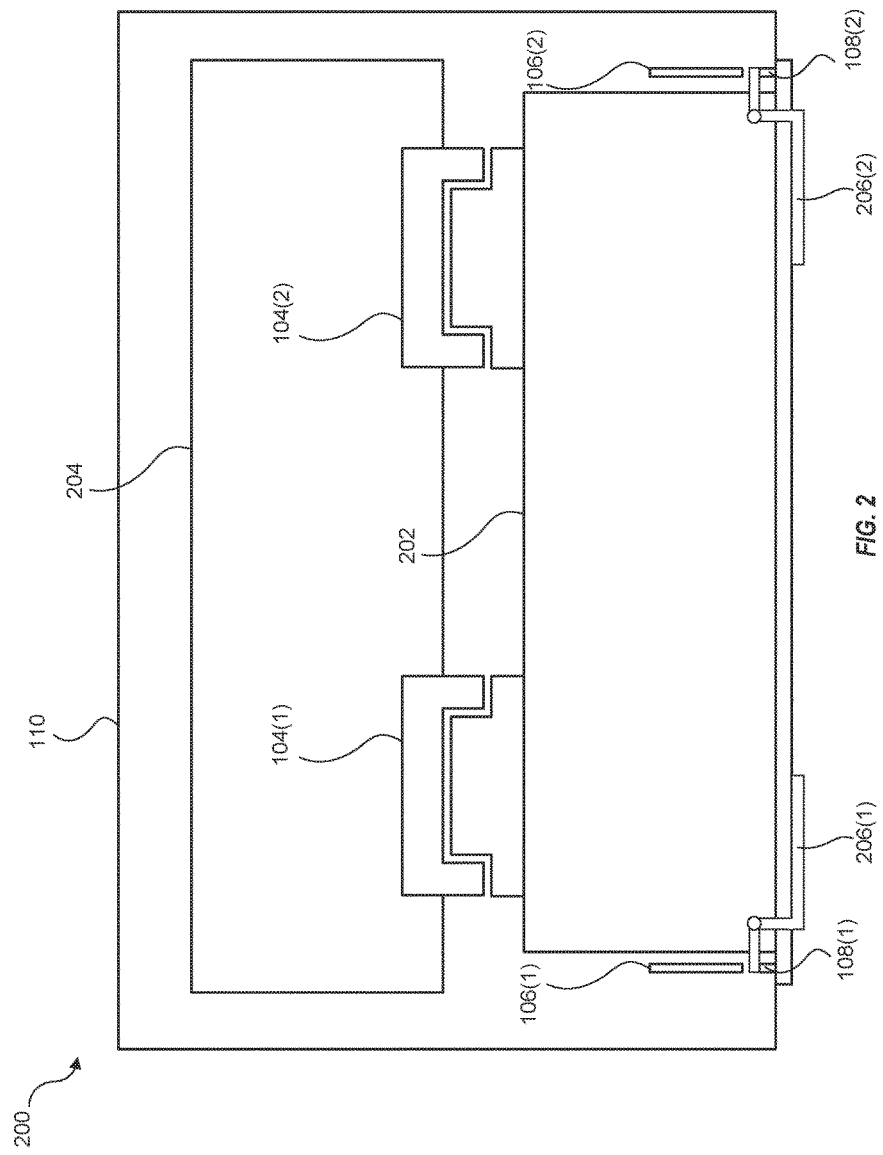
FIG. 2 is a block diagram of an exemplary implementation of an apparatus for improving communicative connections between field-replaceable units and telecommunication systems.

FIG. 2 shows an exemplary implementation 200 of an apparatus for improving communicative connections between field-replaceable units and telecommunication systems. As illustrated in FIG. 2, implementation 200 may include and/or involve a field-replaceable unit 202. The term "field-replaceable unit," as used herein, generally refers to any type or form of circuit board and/or module designed to be replaceable in and/or removable from a telecommunication system after deployment at a network site. Examples of field-replaceable unit 202 include, without limitation, PICs, line cards, Switch Interface Boards (SIBS), control boards, routing engines, communication ports, fan trays, connector interface panels, combinations or variations of one or more of the same, and/or any other suitable field-replaceable unit. Although often discussed herein as being separate and/or distinct from telecommunication system 110, field-replaceable unit 202 may alternatively form and/or be considered part of telecommunication system 110.

In one example, field-replaceable unit 202 may be inserted and/or installed into telecommunication system 110. For example, a network administrator may insert and/or install field-replaceable unit 202 into telecommunication system 110 while telecommunication system 110 continues to run within a network. Upon insertion and/or installation, connectors on field-replaceable unit 202 may connect and/or interface with connectors 104(1) and 104(2). As a result, these connectors may collectively form and/or establish a secure physical and/or communicative connection between field-replaceable unit 202 and telecommunication system 110. Field-replaceable unit 202 may include ports and/or interfaces that facilitate communication within a network and/or across a plurality of networks.

As illustrated in FIG. 2, implementation 200 may also include and/or involve a unit concentrator 204. The term "unit concentrator," as used herein, generally refers to any type or form of circuit board and/or module that communicatively connects certain ports and/or interfaces across a plurality of field-replaceable units installed in a telecommunication system. Examples of unit concentrator 204 include, without limitation, FPCs, backplanes, motherboards of telecommunication systems, combinations or variations of one or more of the same, and/or any other suitable unit concentrator. Although often discussed herein as being separate and/or distinct from telecommunication system 110, unit concentrator 204 may alternatively form and/or be considered part of telecommunication system 110.

As illustrated in FIG. 2, field-replaceable unit 202 may include one or more ejection levers, such as ejection levers 206(1) and 206(2). The term "ejection lever," as used herein, generally refers to any type or form of physical member, object, and/or shaft that is coupled to a field-replaceable unit and/or physically interfaces with an injection cam of a telecommunication system to facilitate securing the field-replaceable unit to the telecommunication system. Examples of ejection levers 206(1) and 206(2) include, without limitation, members, handles, levers, shafts, arms, knobs, portions of one or more of the same, combinations or variations of one or more of the same, and/or any other suitable ejection levers.

In one example, ejection levers 206(1) and 206(2) may each be coupled to field-replaceable unit 202. In this example, ejection levers 206(1) and 206(2) may each be rotatable about an axis of field-replaceable unit 202. For example, upon inserting and/or installing field-replaceable unit 202 into telecommunication system 110, a network administrator may rotate, close, and/or shut ejection levers 206(1) and 206(2) such that they press against movable injection cams 108(1) and 108(2), respectively. Accordingly, ejection levers 206(1) and 206(2) may physically interface with movable injection cams 108(1) and 108(2), respectively.

Once ejection levers 206(1) and 206(2) have physically interfaced with movable injection cams 108(1) and 108(2) in this way, springs 106(1) and 106(2) may apply and/or exert forces on movable injection cams 108(1) and 108(2), respectively. These forces may cause movable injection cams 108(1) and 108(2) to push or pull field-replaceable unit 202 toward connectors 104(1) and 104(2) and/or unit concentrator 204. By applying such forces on movable injection cams 108(1) and 108(2) and thus causing movable injection cams 108(1) and 108(2) to push or pull field-replaceable unit 202 toward connectors 104(1) and 104(2) in this way, springs 106(1) and 106(2) may mitigate and/or decrease the level of de-mate or under-mate that would otherwise exist and/or occur between the connectors of field-replaceable unit 202 and connectors 104(1) and 104(2).

Additionally or alternatively, springs 106(1) and 106(2) may effectively compensate for and/or offset any variation, inconsistency, and/or tolerance resulting from imperfect manufacturing and/or assembly of connectors used to connect field-replaceable unit 202 and telecommunication system 110 with one another. This compensation and/or offset provided by springs 106(1) and 106(2) may facilitate maintaining and/or improving the signal integrity of high-speed traffic (e.g., at or above 25 gigahertz) handled by telecommunication system 110. As a result, telecommunication system 110 and/or field-replaceable unit 202 may be able to avoid software errors, misinterpretations, and/or failures resulting from poor signal integrity. In this way, springs 106(1) and 106(2) may improve and/or increase the performance and/or reliability of telecommunication system 110 and/or field-replaceable unit 202 when handling traffic at high speeds (e.g., at or above 25 gigahertz).

In one example, the forces applied by springs 106(1) and 106(2) may cause movable injection cams 108(1) and 108(2), respectively, to push or pull field-replaceable unit 202 toward connectors 104(1) and 104(2) such that the connectors on field-replaceable unit 202 fully mate with connectors 104(1) and 104(2). The term "fully mate," as used herein with reference to a connection, generally refers to any state and/or condition in which no air gap and/or deficient contact interferes with and/or impairs communications transferred across the connection. Accordingly, in the event that the connectors on field-replaceable unit 202 and connectors 104(1) and 104(2) are fully mated with one another, any air gap that exists and/or occurs between those connectors will not lead to and/or result in any errors, misinterpretations, and/or failures in the software and/or firmware of telecommunication system 110 when handling traffic at a certain speed (e.g., at or above 25 gigahertz). In other words, any air gap that exists and/or occurs between connectors on field-replaceable unit 202 and unit concentrator 204 when fully mated together may have an insignificant and/or negligible effect on the integrity of signals exchanged between field-replaceable unit 202 and unit concentrator 204 via connectors 104(1) and 104(2).

In some examples, connectors 104(1) and 104(2) may include conductors that facilitate exchanging signals between field-replaceable unit 202 and telecommunication system 110 via unit concentrator 204. In such examples, the connectors on field-replaceable unit 202 may include conductors that interface with the conductors in connectors 104(1) and 104(2) such that field-replaceable unit 202 and unit concentrator 204 fully mate with one another.

Figure 3:
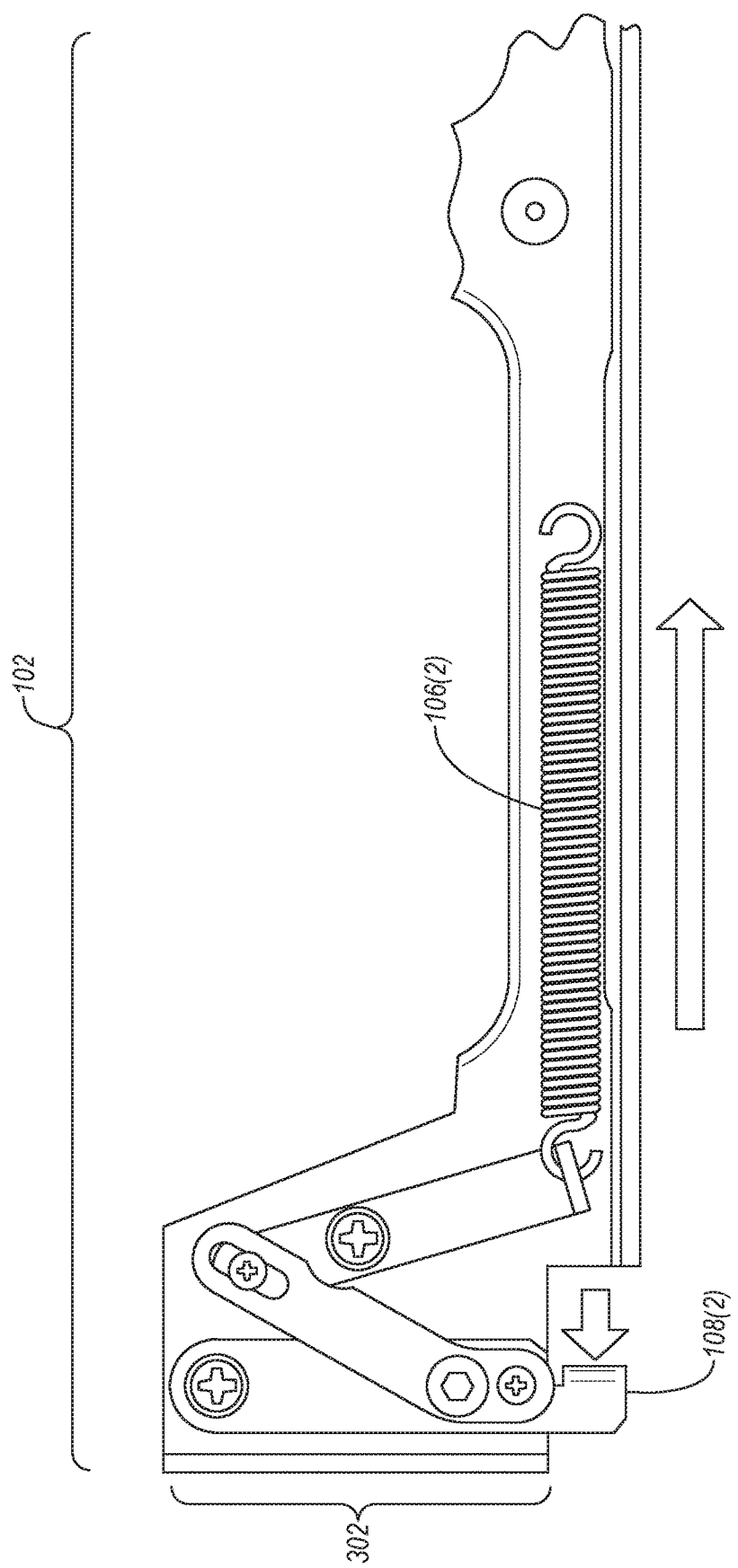
FIG. 3 is an illustration of an exemplary apparatus for improving communicative connections between field-replaceable units and telecommunication systems.

In some examples, springs 106(1) and 106(2) may constitute and/or represent extension and/or tension springs that apply force by way of tension. As a specific example, FIG. 3 illustrates an exemplary spring-loaded mechanism that includes spring 106(2) coupled to housing 102 and a series of pivoted links 302 that connect spring 106(2) to movable injection cam 108(2). In this example, spring 106(2) may constitute and/or represent an extension and/or tension spring that applies tensile force on series of pivoted links 302. Series of pivoted links 302 may connect the extension and/or tension spring to movable injection cam 108(2). Additionally or alternatively, series of pivoted links 302 may transfer tensile force from the extension and/or tension spring to movable injection cam 108(2), thereby applying the tensile force to movable injection cam 108(2).

Continuing with this example, spring 106(2) may pre-load the input link within series of pivoted links 302 with an input force. Series of pivoted links 302 may amplify the amplitude of the input force by the linkage mechanical advantage, thereby resulting in a greater output force applied to the output link (which, in this case, is movable injection cam 108(2)). Moreover, series of pivoted links 302 may reduce the amount of motion generated by and/or at movable injection cam 108(2) by the linkage gear-ratio. This trade-off may make the spring-loaded mechanism less sensitive to variation, inconsistency, and/or tolerance across connectors. Additionally or alternatively, this trade-off may allow and/or facilitate a pseudo-constant insertion force over a small range of motion.

Figure 4:
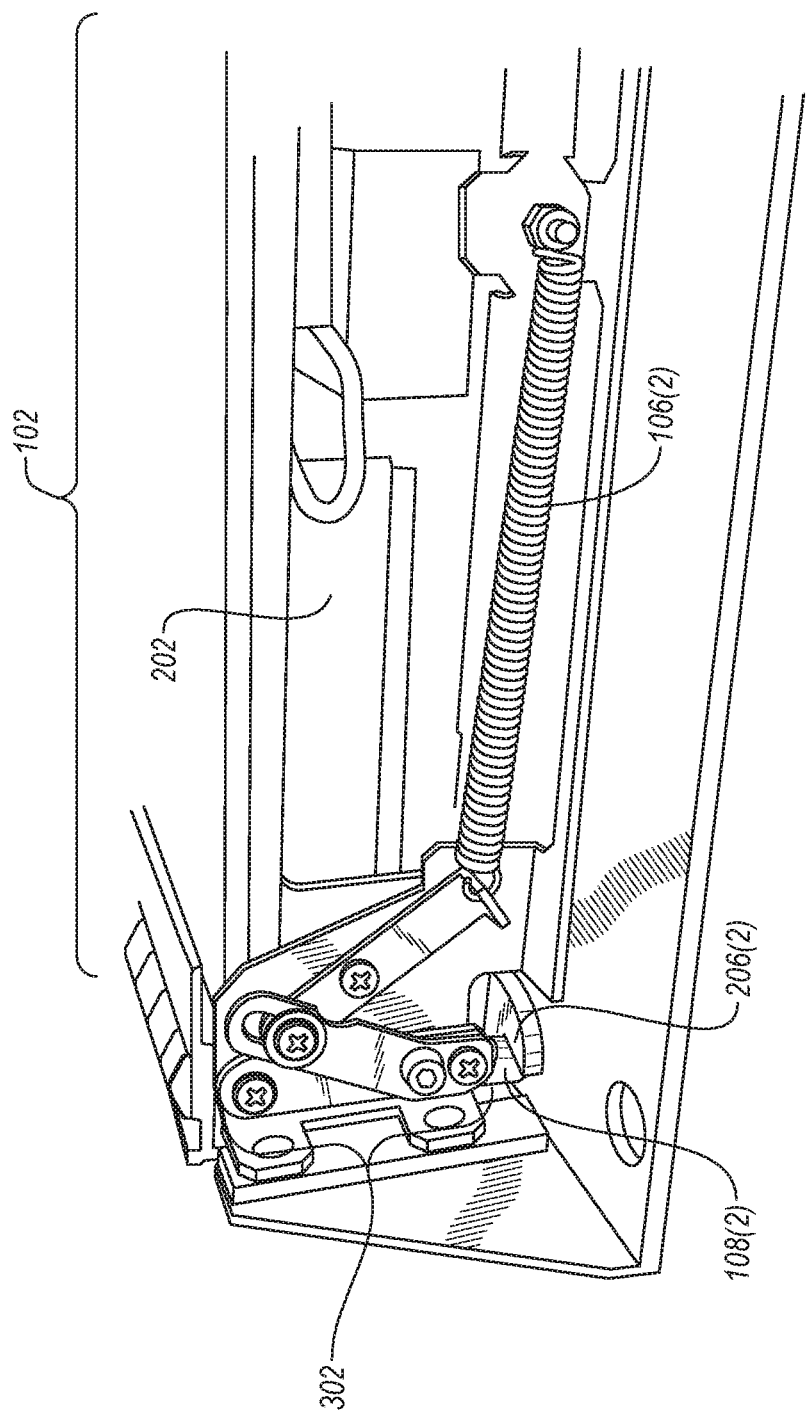
FIG. 4 is an illustration of an exemplary apparatus for improving communicative connections between field-replaceable units and telecommunication systems.

As another specific example, FIG. 4 illustrates an exemplary spring-loaded mechanism that includes spring 106(2) coupled to housing 102 and series of pivoted links 302 that connect spring 106(2) to movable injection cam 108(2). In this example, field-replaceable unit 202 may be inserted and/or installed into housing 102 by rotating, closing, and/or shutting ejection lever 206(2) such that it presses against movable injection cam 108(2). Spring 106(2) may apply tensile force on movable injection cam 108(2). This tensile force may cause movable injection cam 108(2) to push or pull on ejection lever 206(2), thereby driving and/or thrusting field-replaceable unit 202 toward the connection point between field-replaceable unit 202 and unit concentrator 204 (not illustrated in FIG. 4).

Figure 5:
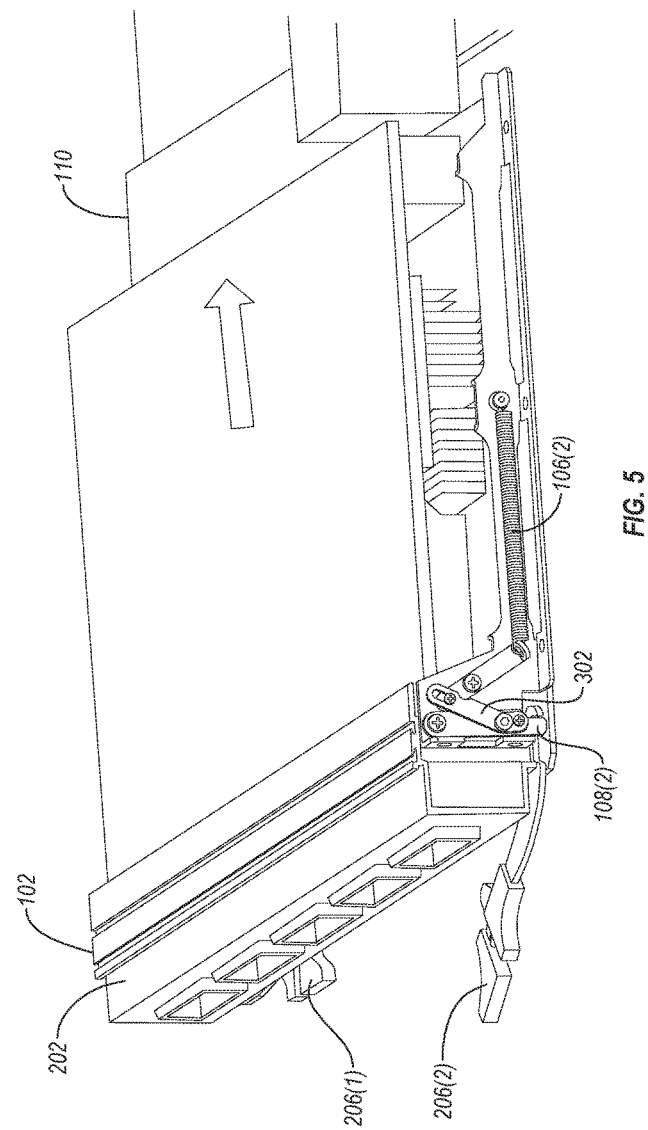
FIG. 5 is an illustration of an exemplary apparatus for improving communicative connections between field-replaceable units and telecommunication systems.

As a further example, FIG. 5 illustrates an exemplary spring-loaded mechanism that includes spring 106(2) coupled to housing 102 and series of pivoted links 302 that connect spring 106(2) to movable injection cam 108(2). In this example, field-replaceable unit 202 may be inserted and/or installed into housing 102 by way of ejection lever 206(2). For example, spring 106(2) may apply tensile force on movable injection cam 108(2). This tensile force may cause movable injection cam 108(2) to push or pull on ejection lever 206(2), thereby driving and/or thrusting field-replaceable unit 202 toward the connection point between field-replaceable unit 202 and unit concentrator 204 (not illustrated in FIG. 5).

Figure 6:
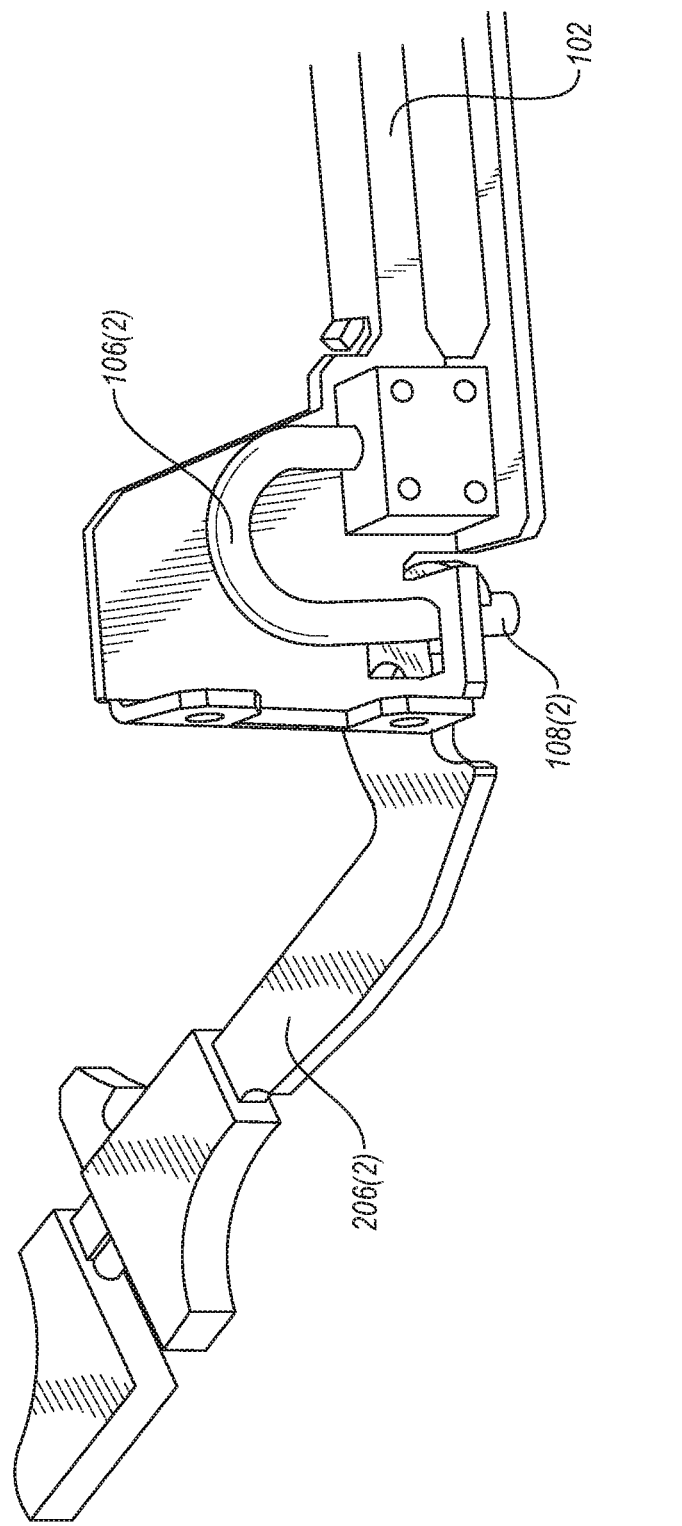
FIG. 6 is an illustration of an exemplary apparatus for improving communicative connections between field-replaceable units and telecommunication systems.

In some examples, springs 106(1) and 106(2) may constitute and/or represent horseshoe leaf springs that apply force by way of pre-loaded bending. As a specific example, FIG. 6 illustrates an exemplary spring-loaded mechanism that includes spring 106(2) coupled to housing 102. In this example, spring 106(2) may constitute and/or represent a horseshoe leaf spring that includes movable injection cam 108(2), which represents the portion of the horseshoe leaf spring that interfaces with and/or applies force to ejection lever 206(2) of field-replaceable unit 202 (not illustrated in FIG. 6). Since ejection lever 206(2) is coupled to field-replaceable unit 202, this force may effectively push or pull field-replaceable unit 202 toward the connection point between field-replaceable unit 202 and unit concentrator 204 (not illustrated in FIG. 6).

Continuing with this example, the horseshoe leaf spring may have one end that is fixed to housing 102 by a yoke clamp and another end (e.g., movable injection cam 108(2)) that is free to move and/or behave in accordance with the spring's output force. As ejection lever 206(2) rotates, closes, and/or shuts onto movable injection cam 108(2), ejection lever 206(2) may grab and/or press against movable injection cam 108(2), thereby causing deflection. The spring's pre-load force may increase the deflection on movable injection cam 108(2) and thrust or drive the connectors of field-replaceable unit 202 (not illustrated in FIG. 6) toward connectors 104(1) and 104(2) of unit concentrator 204 (not illustrated in FIG. 6). Additionally or alternatively, the spring's output force may keep and/or maintain these connectors in a fully mated state and/or condition.

Figure 7:
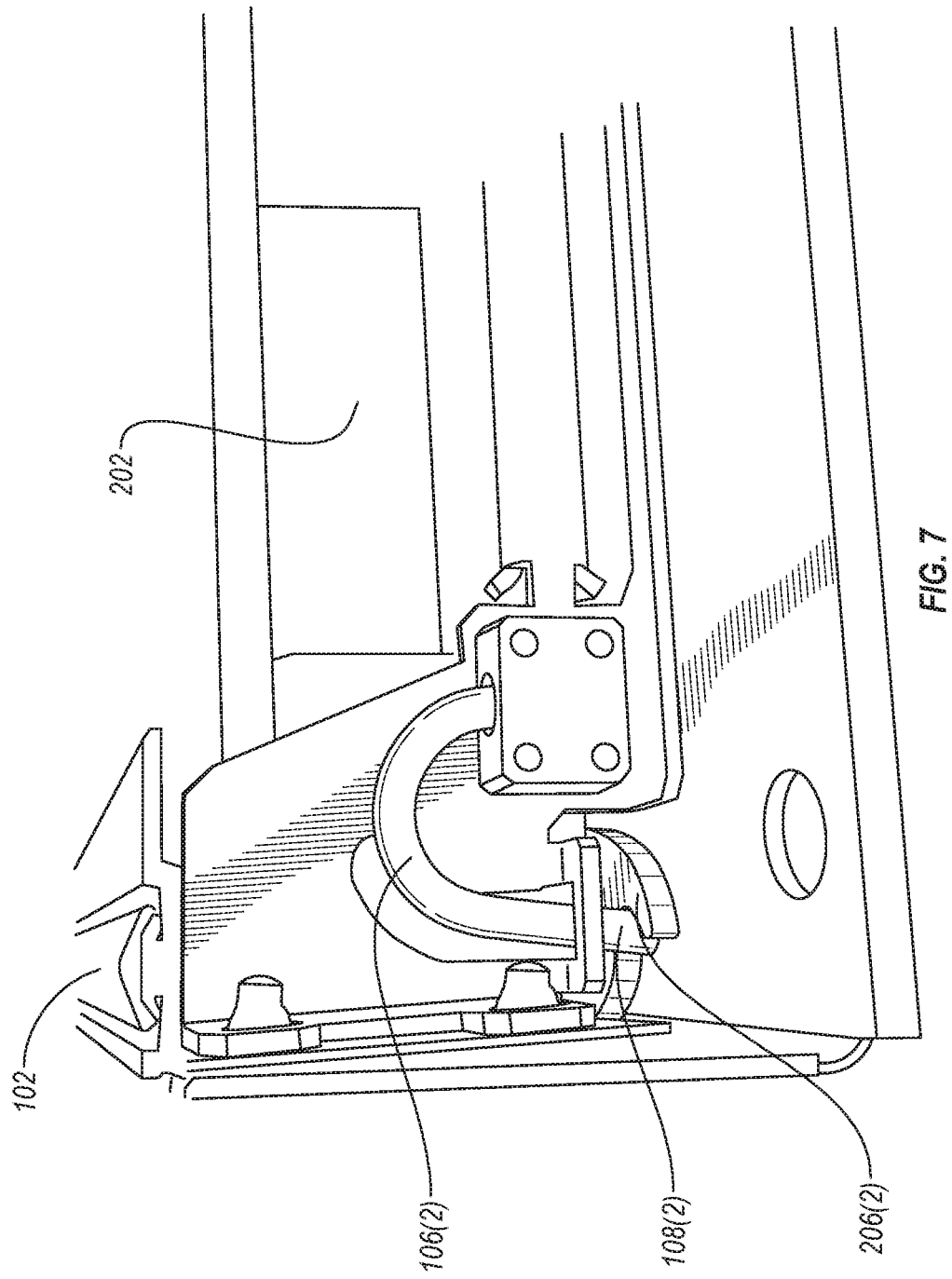
FIG. 7 is an illustration of an exemplary apparatus for improving communicative connections between field-replaceable units and telecommunication systems.

As another example, FIG. 7 illustrates an exemplary spring-loaded mechanism that includes spring 106(2) coupled to housing 102. In this example, field-replaceable unit 202 may be inserted and/or installed into housing 102 by rotating, closing, and/or shutting ejection lever 206(2) such that it presses against movable injection cam 108(2). Spring 106(2) may apply bending force on movable injection cam 108(2). This bending force may cause movable injection cam 108(2) to push or pull on ejection lever 206(2), thereby driving and/or thrusting field-replaceable unit 202 toward the connection point between field-replaceable unit 202 and unit concentrator 204 (not illustrated in FIG. 7).

Figure 8:
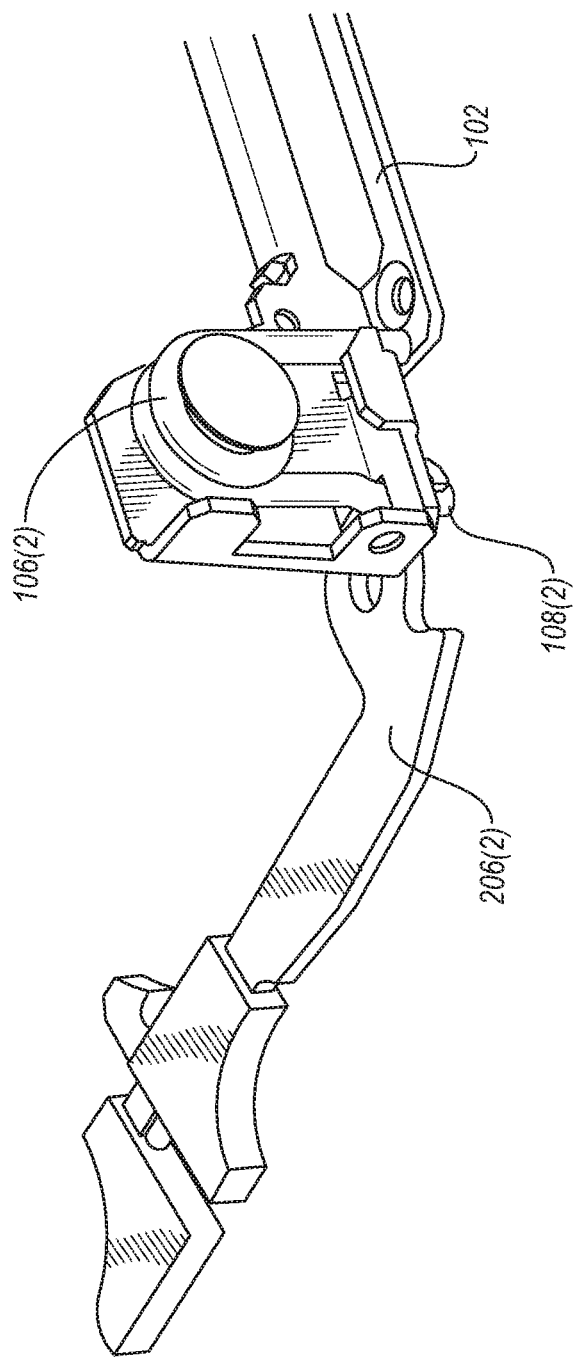
FIG. 8 is an illustration of an exemplary apparatus for improving communicative connections between field-replaceable units and telecommunication systems.

In some examples, springs 106(1) and 106(2) may constitute and/or represent torsion springs that apply force by way of pre-loaded twisting. As a specific example, FIG. 8 illustrates an exemplary spring-loaded mechanism that includes spring 106(2) coupled to housing 102. In this example, spring 106(2) may constitute and/or represent a torsion spring that includes movable injection cam 108(2), which represents the portion of the torsion spring that interfaces with and/or applies force to ejection lever 206(2) of field-replaceable unit 202 (not illustrated in FIG. 8). Since ejection lever 206(2) is coupled to field-replaceable unit 202, this force may effectively push or pull field-replaceable unit 202 toward the connection point between field-replaceable unit 202 and unit concentrator 204 (not illustrated in FIG. 8).

Continuing with this example, the torsion spring may wrap around a mandrel and have one end that is fixed to housing 102. In this example, the other end of the torsion spring may constitute and/or represent movable injection cam 108(2), which is free to move and/or behave in accordance with the spring's output force. As ejection lever 206(2) rotates, closes, and/or shuts onto movable injection cam 108(2), ejection lever 206(2) may grab and/or press against movable injection cam 108(2), thereby causing deflection. The spring's output force applied to ejection lever 206(2) may thrust and/or drive the connectors of field-replaceable unit 202 (not illustrated in FIG. 8) toward connectors 104(1) and 104(2) of unit concentrator 204 (not illustrated in FIG. 8). Additionally or alternatively, the spring's output force may keep and/or maintain these connectors in a fully mated state and/or condition.

Figure 9:
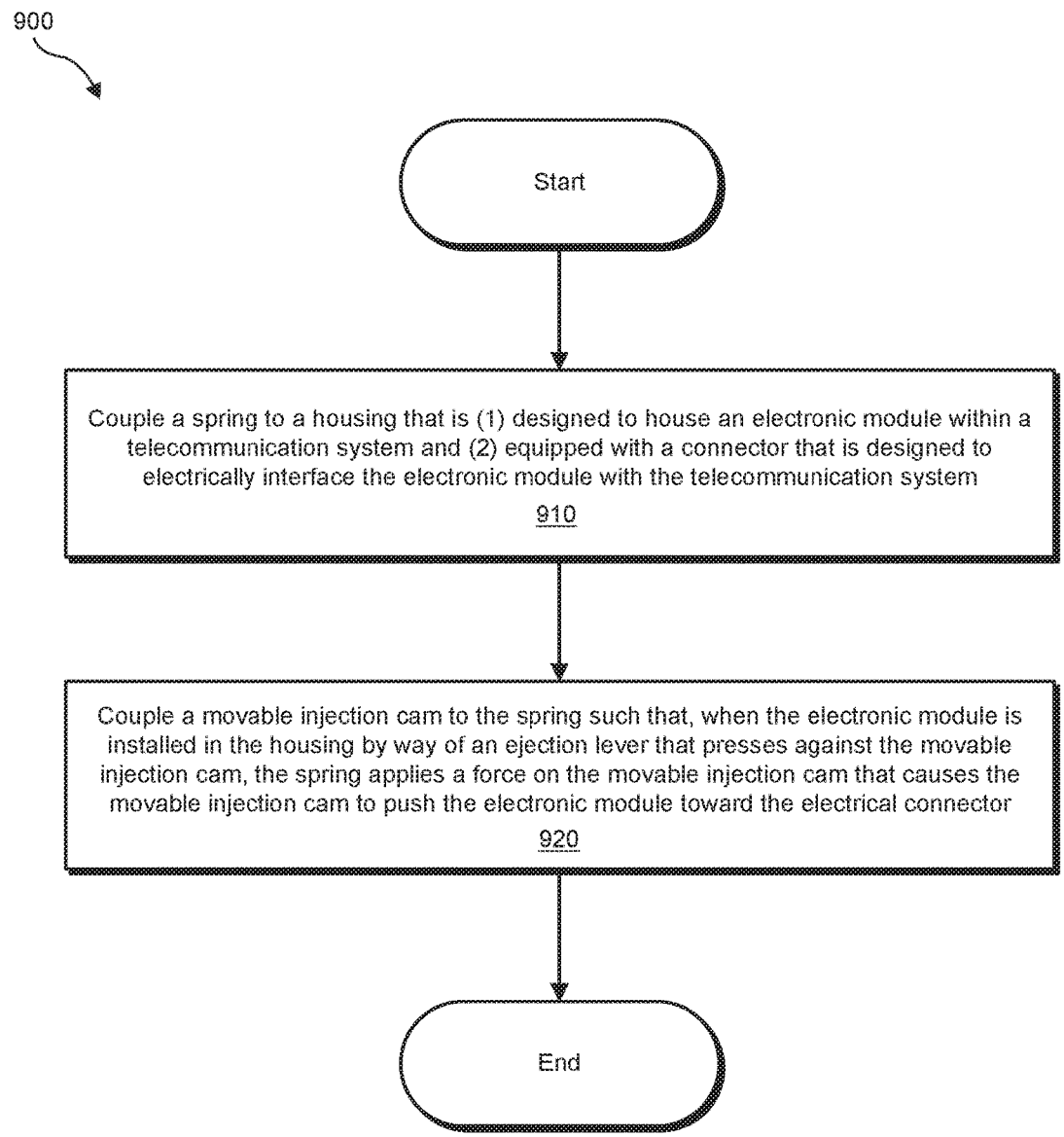
FIG. 9 is a flow diagram of an exemplary method for improving communicative connections between field-replaceable units and telecommunication systems.

FIG. 9 is a flow diagram of an exemplary method 900 for improving communicative connections between field-replaceable units and telecommunication systems. Method 900 may include the step of coupling a spring to a housing that is (1) designed to house a field-replaceable unit within a telecommunication system and (2) equipped with a connector that is designed to communicatively interface the field-replaceable unit with the telecommunication system (910). This coupling step may be performed in a variety of ways. For example, a telecommunication equipment manufacturer may manufacture telecommunication system 110, which includes unit concentrator 204. When manufacturing telecommunication system 110, the telecommunication equipment manufacturer may manually couple springs 106(1) and 106(2) to housing 102 of unit concentrator 204.

Additionally or alternatively, the telecommunication equipment manufacturer may utilize computer-controlled and/or automated robotics to couple springs 106(1) and 106(2) to housing 102 within telecommunication system 110. For example, the telecommunication equipment manufacturer may implement a robotic assembly system that includes certain combinations of hardware, software, and/or firmware. In this example, the robotic assembly system may control a hardware-based robotic tool that physically couples springs 106(1) and 106(2) to housing 102 as directed and/or programmed by certain software and/or firmware modules.

Returning to FIG. 9, method 900 may also include the step of coupling a movable injection cam to the spring such that, when the field-replaceable unit is installed in the housing by way of an ejection lever that presses against the movable injection cam, the spring applies a force on the movable injection cam that causes the movable injection cam to push the field-replaceable unit toward the connector (920). This coupling step may be performed in a variety of ways. For example, a telecommunication equipment manufacturer may manually couple movable injection cams 108(1) and 108(2) to springs 106(1) and 106(2), respectively. Additionally or alternatively, the telecommunication equipment manufacturer may implement a robotic assembly system that controls a hardware-based robotic tool that couples movable injection cams 108(1) and 108(2) to springs 106(1) and 106(2), respectively, as directed and/or programmed by certain software and/or firmware modules.

As explained above in connection with FIGS. 1-9, a spring-loaded insertion mechanism may mitigate, decrease, and/or eliminate de-mate or under-mate that exists and/or occurs between a field-replaceable unit and a telecommunication system. This spring-loaded insertion mechanism may effectively compensate for and/or offset any variation, inconsistency, and/or tolerance resulting from imperfect manufacturing and/or assembly of connectors used to connect the field-replaceable unit and the telecommunication system with one another. This compensation and/or offset may facilitate maintaining and/or improving the signal integrity of high-speed traffic (e.g., at or above 25 gigahertz) handled by the telecommunication system. As a result, the spring-loaded insertion mechanism may enable the telecommunication system to avoid software errors, misinterpretations, and/or failures resulting from poor signal integrity. Accordingly, the spring-loaded insertion mechanism may improve and/or increase the performance and/or reliability of the telecommunication system when forwarding traffic at high speeds (e.g., at or above 25 gigahertz).

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a housing designed to house a field-replaceable unit within a telecommunication system;
   a connector that is designed to communicatively interface the field-replaceable unit with the telecommunication system in the housing;
   a spring that is coupled to the housing; and
   a movable injection cam that is coupled to the spring such that, when the field-replaceable unit is installed in the housing by way of an ejection lever that presses against the movable injection cam, the spring applies a force on the movable injection cam that causes the movable injection cam to push the field-replaceable unit toward the connector.

2. The apparatus of claim 1, wherein the force applied by the spring causes the movable injection cam to push the field-replaceable unit toward the connector such that the field-replaceable unit fully mates with the connector.

3. The apparatus of claim 2, wherein the field-replaceable unit fully mates with the connector such that no air gap exists between the field-replaceable unit and the connector.

4. The apparatus of claim 2, wherein the field-replaceable unit fully mates with the connector such that any air gap that exists between the field-replaceable unit and the connector has a negligible effect on the integrity of signals exchanged between the field-replaceable unit and the telecommunication system via the connector.

5. The apparatus of claim 1, wherein:
   the connector includes one or more conductors that facilitate exchanging signals between the field-replaceable unit and the telecommunication system; and
   the field-replaceable unit includes one or more conductors that interface with the conductors of the connector such that the field-replaceable unit and the connector fully mate with one another.

6. The apparatus of claim 1, wherein the spring comprises an extension spring that applies the force by way of tension.

7. The apparatus of claim 6, further comprising a spring-loaded linkage mechanism that includes:
   the extension spring;
   the movable injection cam; and
   a series of pivoted links that connect the extension spring to the movable injection cam.

8. The apparatus of claim 1, wherein the spring comprises a leaf spring that applies the force by way of bending.

9. The apparatus of claim 1, wherein the spring comprises a torsion spring that applies the force by way of twisting.

10. The apparatus of claim 1, wherein the ejection lever is coupled to the field-replaceable unit and rotatable about an axis of the field-replaceable unit.

11. A telecommunication system comprising:
   a housing designed to house a field-replaceable unit;
   a connector that is coupled to a unit concentrator and designed to communicatively interface the field-replaceable unit with the unit concentrator in the housing;
   a spring that is coupled to the housing; and
   a movable injection cam that is coupled to the spring such that, when the field-replaceable unit is installed in the housing by way of an ejection lever that presses against the movable injection cam, the spring applies a force on the movable injection cam that causes the movable injection cam to push the field-replaceable unit toward the connector.

12. The telecommunication system of claim 11, wherein the force applied by the spring causes the movable injection cam to push the field-replaceable unit toward the connector such that the field-replaceable unit fully mates with the connector.

13. The telecommunication system of claim 12, wherein the field-replaceable unit fully mates with the connector such that no air gap exists between the field-replaceable unit and the connector.

14. The telecommunication system of claim 12, wherein the field-replaceable unit fully mates with the connector such that any air gap that exists between the field-replaceable unit and the connector has a negligible effect on the integrity of signals exchanged between the field-replaceable unit and the telecommunication system via the connector.

15. The telecommunication system of claim 11, wherein:
   the connector includes one or more conductors that facilitate exchanging signals between the field-replaceable unit and the telecommunication system; and
   the field-replaceable unit includes one or more conductors that interface with the conductors of the connector such that the field-replaceable unit and the connector fully mate with one another.

16. The telecommunication system of claim 11, wherein the spring comprises an extension spring that applies the force by way of tension.

17. The telecommunication system of claim 16, further comprising a spring-loaded linkage mechanism that includes:
   the extension spring;
   the movable injection cam; and
   a series of pivoted links that connect the extension spring to the movable injection cam.

18. The telecommunication system of claim 11, wherein the spring comprises a leaf spring that applies the force by way of bending.

19. The telecommunication system of claim 11, wherein the spring comprises a torsion spring that applies the force by way of twisting.

20. A method comprising:
   coupling a spring to a housing that is:
      designed to house a field-replaceable unit within a telecommunication system; and
      equipped with a connector that is designed to communicatively interface the field-replaceable unit with the telecommunication system; and
   coupling a movable injection cam to the spring such that, when the field-replaceable unit is installed in the housing by way of an ejection lever that presses against the movable injection cam, the spring applies a force on the movable injection cam that causes the movable injection cam to push the field-replaceable unit toward the connector.

* * * * *